United States Patent
Tseng et al.

(10) Patent No.: US 9,644,257 B2
(45) Date of Patent: May 9, 2017

(54) METHOD OF FABRICATING COMPOSITE PDMS MICROSTRUCTURE

(71) Applicant: NATIONAL TSING HUA UNIVERSITY, Hsinchu (TW)

(72) Inventors: Fan-Gang Tseng, New Taipei (TW);
Pen-Cheng Wang, Hsinchu (TW);
Tung-Yua Lee, Hsinchu (TW);
Chun-Ting Lin, New Taipei (TW)

(73) Assignee: NATIONAL TSING HUA UNIVERSITY, Hsinchu (TW)

( * ) Notice: Subject to any disclaimer, the term of this patent is extended or adjusted under 35 U.S.C. 154(b) by 0 days.

(21) Appl. No.: 14/829,621

(22) Filed: Aug. 18, 2015

(65) Prior Publication Data
US 2016/0326629 A1 Nov. 10, 2016

(30) Foreign Application Priority Data
May 8, 2015 (TW) .............................. 104114760 A

(51) Int. Cl.
| | |
|---|---|
| *C23C 14/24* | (2006.01) |
| *C23C 14/14* | (2006.01) |
| *C23C 14/58* | (2006.01) |
| *C23C 14/02* | (2006.01) |

(52) U.S. Cl.
CPC ............ *C23C 14/14* (2013.01); *C23C 14/024* (2013.01); *C23C 14/5873* (2013.01)

(58) Field of Classification Search
CPC ....... C23C 14/24; C23C 14/021; C23C 14/14; C23C 14/205; C23C 14/34; C23C 14/542; C23C 14/5873; C23C 14/45525
See application file for complete search history.

(56) References Cited

U.S. PATENT DOCUMENTS

| | | | | |
|---|---|---|---|---|
| 6,060,256 | A * | 5/2000 | Everhart ................. | A61F 13/42 427/2.13 |
| 2011/0244116 | A1* | 10/2011 | Badre .................... | B82Y 30/00 427/58 |
| 2013/0078740 | A1* | 3/2013 | Miller .................... | G01N 21/05 436/501 |

OTHER PUBLICATIONS

Ikjoo Byun et al., "Transfer of thin Au films to polydimethylsiloxane (PDMS) with reliable bonding using (3-mercaptopropyl)trimethoxysilane (MPTMS) as a molecular adhesive", Journal of Micromechanics and Microengineering, published on Aug. 2013, vol. 23, No. 8, 10 pages, published by IOP Publishing, United Kingdom.

(Continued)

*Primary Examiner* — Duy Deo
*Assistant Examiner* — Mahmoud Dahimene
(74) *Attorney, Agent, or Firm* — CKC & Partners Co., Ltd.

(57) ABSTRACT

A method of fabricating a composite PDMS microstructure includes a defining step, a depositing step and an etching step. The defining step is performed for defining a patterned area having a mono-molecule with a thiol group on a PDMS substrate, and the mono-molecule with the thiol group is in liquid phase. The depositing step is performed for placing the PDMS substrate having the mono-molecule with the thiol group into a vacuum chamber within an activation time so as to deposit one Au atom on the patterned area of the PDMS substrate by a vacuum coating process. The etching step is performed for cleaning the PDMS substrate using water, and thus the Au atom can be selectively retained on the patterned area of the PDMS substrate.

4 Claims, 7 Drawing Sheets

(56) References Cited

OTHER PUBLICATIONS

Ikjoo Byun et al., "Microcontact printing using a flat metal-embedded stamp fabricated using a dry peel-off process", RSC Advances, published on Dec. 21, 2013, Issue 47, 5 Pages, published by Royal Society of Chemistry, United Kingdom.
Mei Zhu et al., "Facile metal transfer method for fabricating unconventional metamaterial devices", Optical Materials Express, published on Apr. 1, 2015, vol. 5, Issue 4, pp. 733-741, published by the Optical Society (OSA), United States.

* cited by examiner

100

```
┌─────────────────────────────────────┐
│  defining a patterned area having a │
│  mono-molecule with a thiol group on a PDMS │ ─ 200
│  substrate, and the mono-molecule with the thiol │
│        group is in liquid phase     │
└─────────────────────────────────────┘
                  ⇩
┌─────────────────────────────────────┐
│   placing the PDMS substrate having the │
│    mono-molecule with the thiol group into a │
│   vacuum chamber within an activation time so as │ ─ 300
│   to deposit one Au atom on the patterned area of │
│   the PDMS substrate by a vacuum coating process │
└─────────────────────────────────────┘
                  ⇩
┌─────────────────────────────────────┐
│  cleaning the PDMS substrate using water so │
│   as to selectively retain the Au atom on the │ ─ 400
│      patterned area of the PDMS substrate │
└─────────────────────────────────────┘
```

METHOD OF FABRICATING COMPOSITE PDMS MICROSTRUCTURE

RELATED APPLICATIONS

This application claims priority to Taiwan Application Serial Number 104114760, filed May 8, 2015, which is herein incorporated by reference.

BACKGROUND

Technical Field

The present disclosure relates to a method of fabricating a composite polydimethylsiloxane (PDMS) microstructure. More particularly, the present disclosure relates to a method of fabricating a composite PDMS microstructure with high adhesion strength, high stability, and accurate controllability of structure thickness and film quality.

Description of Related Art

An organosilane is often used for treating the surface of silicon substrate. Different functional groups of the organosilane can enable the surface of silicon substrate to produce different physical and chemical properties. When the organosilane meets water molecules, a hydrolysis reaction occurs to produce Si—OH, and then Si—OH is reacted with the silicon substrate to form Si—O—Si bonds. Combining Au with polydimethylsiloxane (PDMS) is a general technology in the biomedical field. Since PDMS has excellent biocompatibility and environmental stress tolerance, a Au-PDMS structure is often used as a flexible electrode and is often applied to the field of biological detection.

Conventionally, a transfer method is used for fabricating a Au-PDMS microstructure, in which Au is first treated by 3-mercaptopropyl trimethoxysilane (MPTMS) to form a Au-MPTMS structure and, then the Au-MPTMS structure is combined with a PDMS microstructure. However, the conventional transfer method is not suitable for forming a Au pattern on the PDMS microstructure. Another conventional fabricating method is to directly stamp Au onto the PDMS microstructure. However, this method is difficult to control the thickness and the quality of the Au film. Therefore, it is commercially desirable to develop a method with high thickness controllability simple process controllability for fabricating a composite PDMS microstructure with high adhesion strength and strong chemical bond.

SUMMARY

According to one aspect of the present disclosure, a method of fabricating a composite PDMS microstructure includes a defining step, a depositing step and an etching step. The defining step is performed for defining a patterned area having a mono-molecule with a thiol group on a PDMS substrate, and the mono-molecule with the thiol group is in liquid phase. The depositing step is performed for placing the PDMS substrate having the mono-molecule with the thiol group into a vacuum chamber within an activation time, and then depositing one Au atom on the patterned area of the PDMS substrate by a vacuum coating process. The etching step is performed for cleaning the PDMS substrate using water, and thus the Au atom can be selectively retained on the patterned area of the PDMS substrate.

According to another aspect of the present disclosure, a method of fabricating a composite PDMS microstructure includes a defining step, a depositing step and an etching step. The defining step is performed for defining a patterned area having MPTMS on a PDMS substrate, and the MPTMS is in liquid phase. The depositing step is performed for placing the PDMS substrate having MPTMS into a vacuum chamber within an activation time, and then depositing one Au atom on the patterned area of the PDMS substrate by a vacuum coating process. The etching step is performed for cleaning the PDMS substrate using water, and thus the Au atom can be selectively retained on the patterned area of the PDMS substrate.

According to further another aspect of the present disclosure, a method of fabricating a composite PDMS microstructure is provided. A microarray pattern is defined on a female mold by using a photolithography technique and an etching technique. The microarray pattern has a pattern area. A first agent having PDMS is mixed with a second agent having PDMS at a weight ratio of 10:1 to generate a PDMS mixture. The PDMS mixture is placed into a vacuum chamber and then air bubbles are removed from the PDMS mixture by using a vacuum pump within an activation time. Then, the PDMS mixture processed by the vacuum pump is placed into the female mold, and is baked in an oven at 80° C. for 2 hours for curing. Thereafter, the cured PDMS mixture is demolded from the female mold and then is etched, and the PDMS mixture is perforated to form a plurality of holes. The perforated PDMS mixture is cleaned and then is immersed in 6 M aqueous solution of sulfuric acid at 80° C. for 1 hour. Then, the cleaned PDMS mixture is immersed in methanol twice for forming a PDMS substrate. Then, the PDMS substrate is immersed in 0.5 M methanol of MPTMS for 10 seconds. Thereafter, the PDMS substrate is taken out and then is dried by using nitrogen. One Au atom is evaporated on the PDMS substrate at an evaporation rate for forming a Au film, and the Au film has a thickness.

BRIEF DESCRIPTION OF THE DRAWINGS

The present disclosure can be more fully understood by reading the following detailed description of the embodiment, with reference made to the accompanying drawings as follows:

FIG. 1 is a flow chart showing a method of fabricating a composite PDMS microstructure according to one embodiment of the present disclosure;

DETAILED DESCRIPTION

Figure 2A:
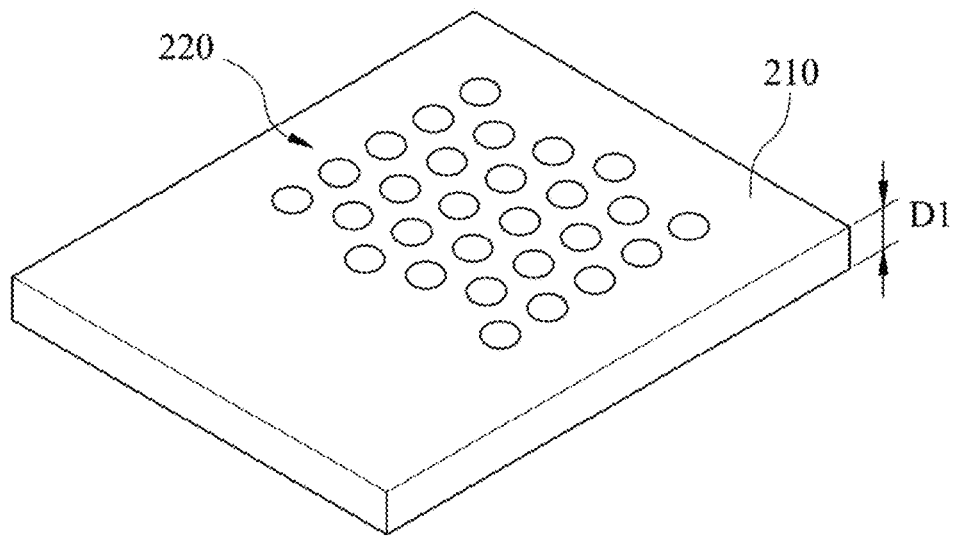
FIGS. 2A and 2B are schematic diagrams showing the composite PDMS microstructure fabricated by the method shown in FIG. 1.
Figure 2B:
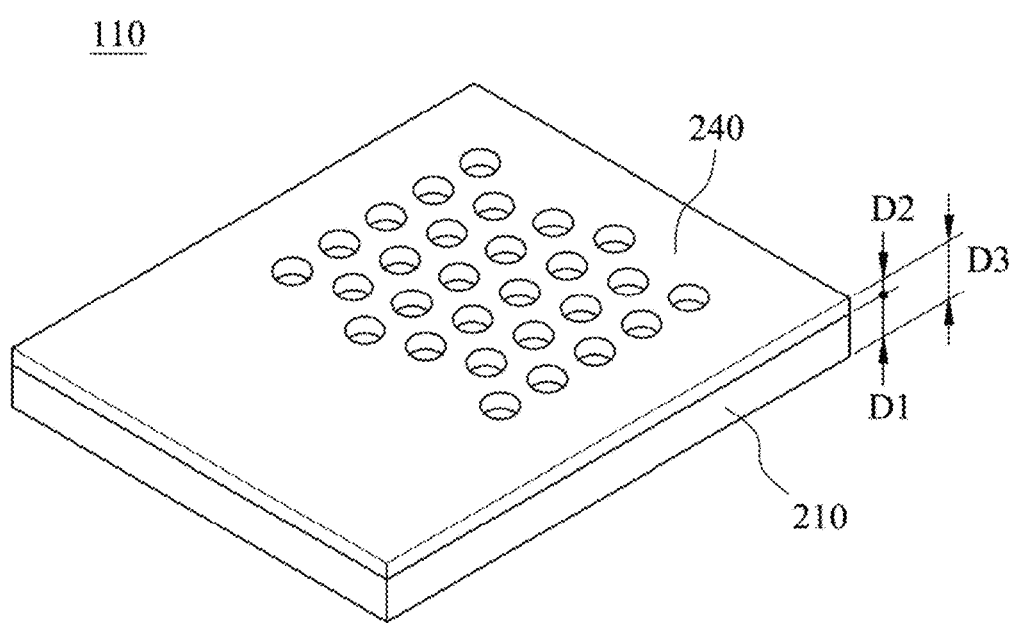

FIG. 1 is a flow chart showing a method 100 of fabricating a composite polydimethylsiloxane (PDMS) microstructure 110 according to one embodiment of the present disclosure; and FIGS. 2A and 2B are schematic diagrams showing the composite PDMS microstructure 110 fabricated by the method shown in FIG. 1. In FIG. 1, the method 100 of fabricating the composite PDMS microstructure includes a defining step 200, a depositing step 300, and an etching step 400.

The defining step 200 is performed for defining a patterned area 220 having a mono-molecule with a thiol group on a PDMS substrate 210, and the mono-molecule with the thiol group is in liquid phase. The PDMS substrate 210 has a thickness D1 greater than or equal to about 50 μm and smaller than or equal to about 300 μm. In FIG. 2A, the thickness D1 is equal to about 100 μm.

The depositing step 300 is performed for placing the PDMS substrate 210 having the mono-molecule with the thiol group into a vacuum chamber within an activation time and then depositing a plurality of Au atoms 240 on the patterned area 220 of the PDMS substrate 210 by a vacuum coating process, so as to form a Au film. The vacuum coating process can be an evaporation process, a sputtering process or an atomic layer epitaxy process. No matter what kind of vacuum coating process is used, the chemical bond between the mono-molecule with the thiol group and the Au atom 240 can be enhanced effectively, so that the adhesion strength between the PDMS substrate 210 and the Au atom 240 is enhanced. In addition, the Au film has a thickness D2 greater than or equal to about 5 nm and smaller than or equal to about 5000 nm. In FIG. 2B, the thickness D2 is equal to about 100 nm. The deposition conditions of vacuum coating process can be freely controlled to adjust the thickness D2 of the Au film and the quality of the Au film, and thus the composite PDMS microstructure 110 has high adhesion strength and high stability, and can be used as a wire element or an electrode.

The etching step 400 is performed for cleaning the PDMS substrate 210 using water, in which the Au atom 240 outside the patterned area 220 is washed out, thereby selectively retaining the Au atom 240 on the patterned area 220 of the PDMS substrate 210. The composite PDMS microstructure 110 is then formed after the etching step 400. The composite PDMS microstructure 110 has a thickness D3 equal to the sum of the thickness D1 and the thickness D2 (i.e. D3=D1+D2). Hence, the composite PDMS microstructure 110 is formed from the PDMS substrate 210 which is processed by the special mono-molecule with the thiol group. The adhesion strength between the PDMS substrate 210 and the Au atom 240 can be enhanced owing to the chemical bond between the special mono-molecule with the thiol group and the Au atom 240. Moreover, the method 100 can be performed easily, and is suitable for fabricating biomedical materials and mass production of consumer electronic products.

Figure 3:
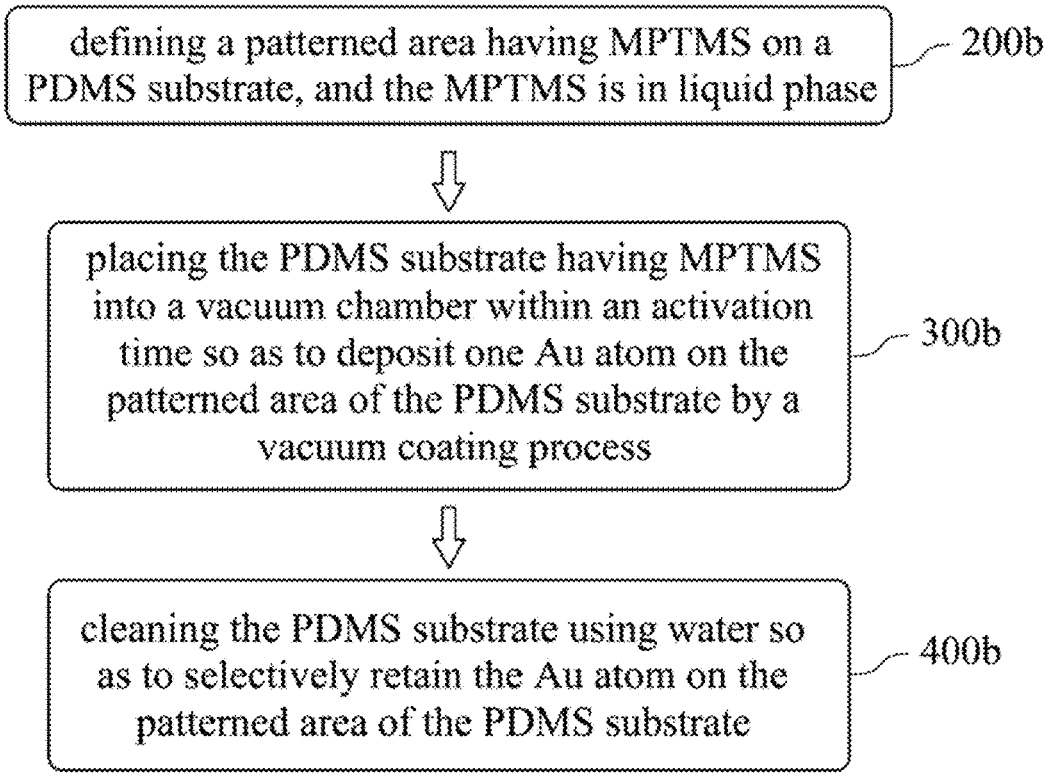
FIG. 3 is a flow chart showing a method of fabricating a composite PDMS microstructure according to another embodiment of the present disclosure.
Figure 4A:
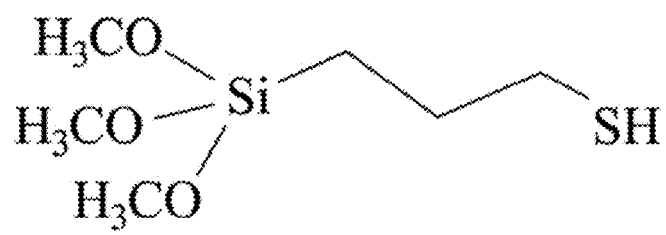
FIG. 4A is a chemical structure of a MPTMS molecule used in FIG. 3.
Figure 4B:
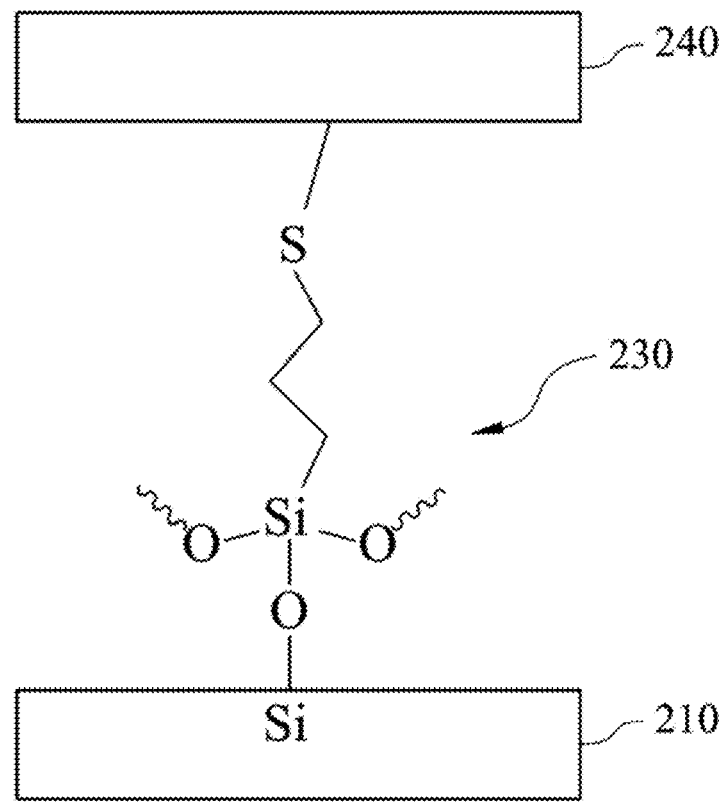
FIG. 4B is a schematic diagram showing the composite PDMS microstructure used in FIG. 3.

FIG. 3 is a flow chart showing a method 100b of fabricating a composite PDMS microstructure according to another embodiment of the present disclosure; FIG. 4A is a chemical structure of a MPTMS molecule 230 used in FIG. 3; and FIG. 4B is a schematic diagram showing the composite PDMS microstructure 110b used in FIG. 3. In FIG. 3, the method 100b of fabricating the composite PDMS microstructure includes a defining step 200b, a depositing step 300b, and an etching step 400b.

The processes of the depositing step 300b and the etching step 400b shown in FIG. 3 are the same as the depositing step 300 and the etching step 400 shown in FIG. 1. In FIG. 3, a 3-mercaptopropyl trimethoxysilane (MPTMS) molecule 230 is specifically used as the mono-molecule with the thiol group. The MPTMS molecule 230 can be used in the method 100b for fabricating the composite PDMS microstructure 110b having high adhesion strength and the controllable thickness D2.

In detail, the defining step 200b is performed for defining a patterned area 220 having MPTMS molecule 230 on a PDMS substrate 210, and the MPTMS molecule 230 is liquid phase. The depositing step 300b is performed for placing the PDMS substrate 210 having MPTMS into a vacuum chamber within an activation time, and then depositing Au atoms 240 on the patterned area 220 of the PDMS substrate 210 by a vacuum coating process. The etching step 400b is performed for cleaning the PDMS substrate 210 by the water, and thus the Au atom 240 outside the patterned area 220 is washed out, hereby selectively retaining the Au atom 240 on the patterned area 220 of the PDMS substrate 210. Therefore, the composite PDMS microstructure 110b is formed from the PDMS substrate 210 which is processed by the MPTMS molecule 230. The adhesion strength between the PDMS substrate 210 and the Au atom 240 can be significantly enhanced owing to the strong chemical bond between the MPTMS molecule 230 and the Au atom 240.

Figure 5:
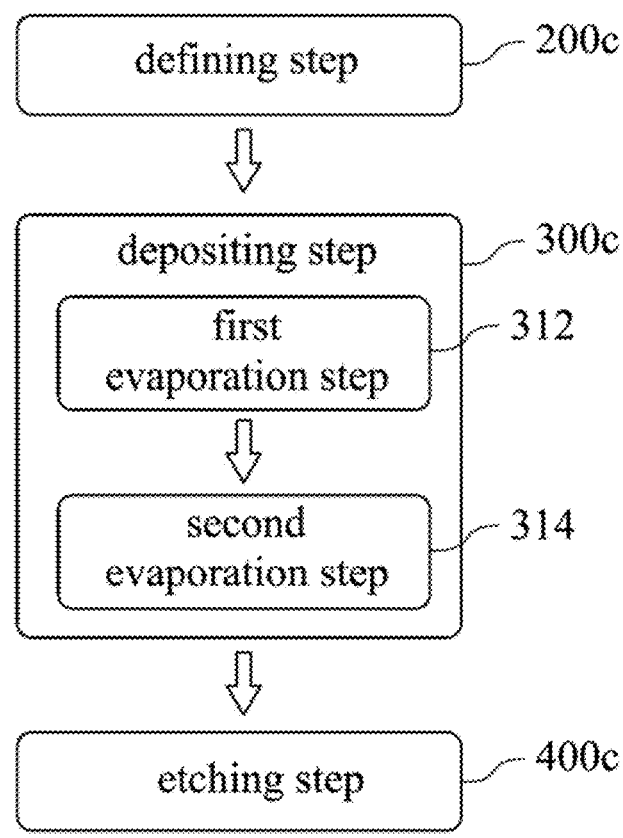
FIG. 5 is a flow chart showing a method of fabricating a composite PDMS microstructure according to further another embodiment of the present disclosure.

FIG. 5 is a flow chart showing a method 100c of fabricating a composite PDMS microstructure according to further another embodiment of the present disclosure. In FIG. 5, the method 100c of fabricating the composite PDMS microstructure includes a defining step 200c, a depositing step 300c, and an etching step 400c.

The processes of the defining step 200c and the etching step 400c are the same as the defining step 200b and the etching step 400b shown in FIG. 3. In FIG. 5, the depositing step 300c is performed for placing the PDMS substrate 210 having MPTMS into a vacuum chamber within an activation time, and then depositing Au atoms 240 on the patterned area 220 of the PDMS substrate 210 by a vacuum coating process. In one example, the vacuum coating process is an evaporation process. In addition, the depositing step 300c further includes a first evaporation step 312 and a second evaporation step 314. The first evaporation step 312 is performed for treating the PDMS substrate 210 by 0.5 M methanol of the mono-molecule with the thiol group for 10 seconds. The second evaporation step 314 is performed for evaporating the Au atoms 240 at an evaporation rate of 0.5 A/sec to form a Au film. The Au film has a thickness D2 greater than or equal to 5 nm and smaller than or equal to 5000 nm after the second evaporation step 314. In the example illustrated in FIG. 2B, the thickness D2 is equal to 100 nm. Therefore, the deposition conditions of the evaporation process can be freely controlled to adjust the thickness D2. The adhesion strength of the composite PDMS microstructure 110b can be significantly enhanced owing to the strong chemical bond between the MPTMS molecule 230 and the Au atom 240.

Figure 6:
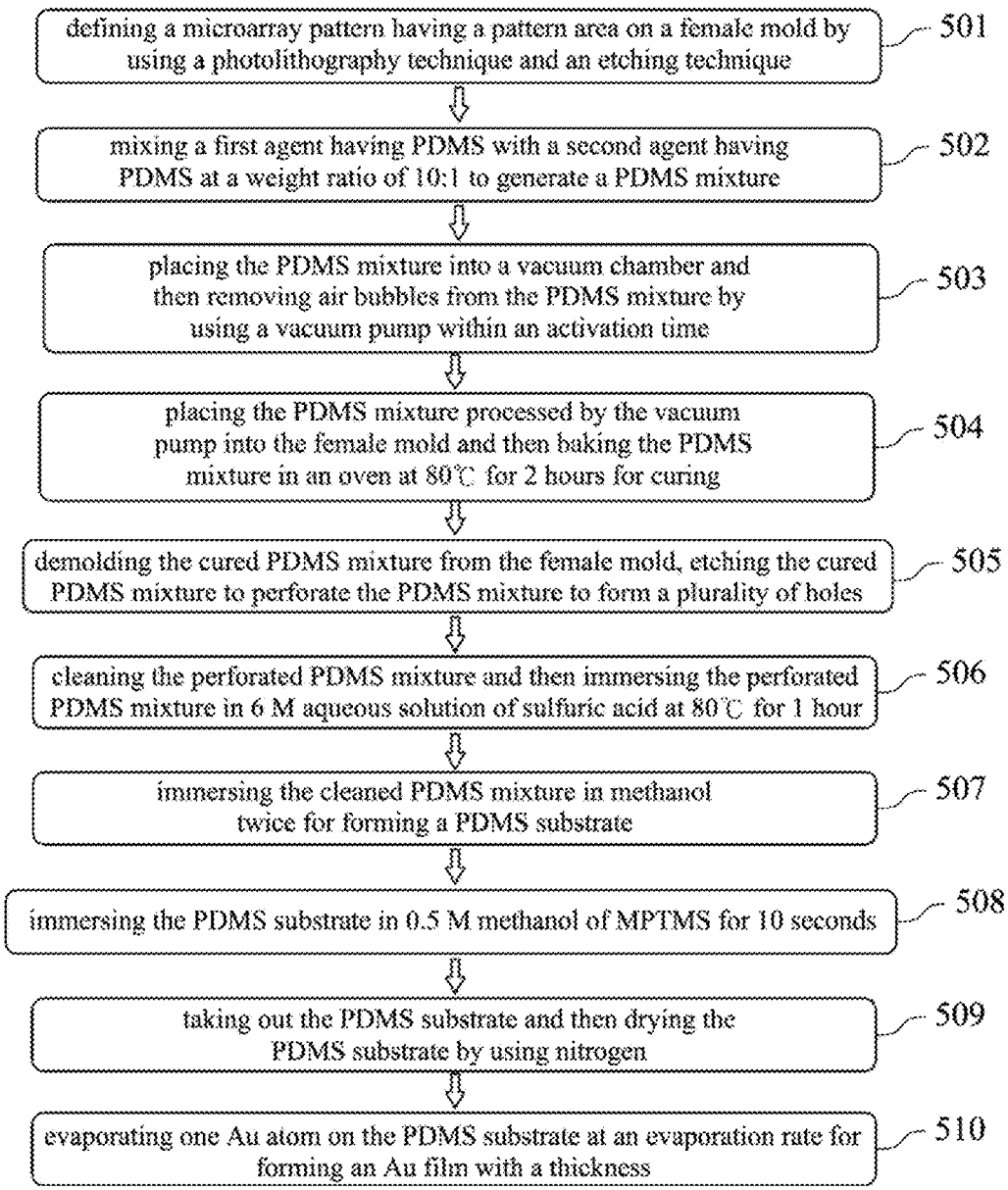
FIG. 6 is a flow chart showing a method of fabricating a composite PDMS microstructure according to still another embodiment of the present disclosure.

FIG. 6 is a flow chart showing a method 500 of fabricating a composite PDMS microstructure according to still another embodiment of the present disclosure, and it is a more detailed flow chart illustrating each step of the embodiment. In FIG. 6, the method 500 of fabricating the composite PDMS microstructure includes steps 501-510.

In step 501, a microarray pattern is defined on a female mold by using a photolithography technique and an etching technique. The microarray pattern has a pattern area 220. In other words, step 501 is performed for defining the pattern area 220 on a silicon substrate. The female mold may be circular and has a microarray structure.

In step 502, a first agent having PDMS is mixed with a second agent having PDMS at a weight ratio of 10:1 to generate a PDMS mixture.

In step 503, the PDMS mixture is placed into a vacuum chamber and then air bubbles thereof is removed by a vacuum pump within an activation time. The activation time is 30 minutes, and step 503 may be used to ensure that the chemical bond between the MPTMS molecule 230 and the Au atom 240 is strong enough.

In step 504, the PDMS mixture is placed into the female mold, and then is baked in an oven at 80° C. for 2 hours.

In step 505, the cured PDMS mixture is demolded from the female mold and then is etched, and the PDMS mixture is perforated to form a plurality of holes.

In step 506, the perforated PDMS mixture is cleaned, and then is placed into 6 M aqueous solution of sulfuric acid at 80° C. for 1 hour.

In step 507, the PDMS mixture is immersed in methanol twice for forming a PDMS substrate.

In step 508, the PDMS substrate is immersed in 0.5 M methanol of MPTMS molecule 230 for 10 seconds.

In step 509, the PDMS substrate is taken out and then is dried by nitrogen gas.

In step 510, at least one Au atom 240 is evaporated on the PDMS substrate at a specified evaporation rate 0.5 A/sec, and thus a Au film is formed. The Au film has a thickness D2 which is equal to 100 nm.

After steps 501-510 are performed, a composite PDMS microstructure 110b is fabricated. The thickness D2 of the Au film, the quality of the Au film and the chemical bond between the MPTMS molecule 230 and the Au atom 240 can be precisely controlled by controlling the deposition conditions of the Au atom 240, such as the evaporation rate, the activation time, temperature, etc. In FIG. 6, the thickness D2 of the Au film may be accurately controlled to be within 100 nm.

Figure 7A:
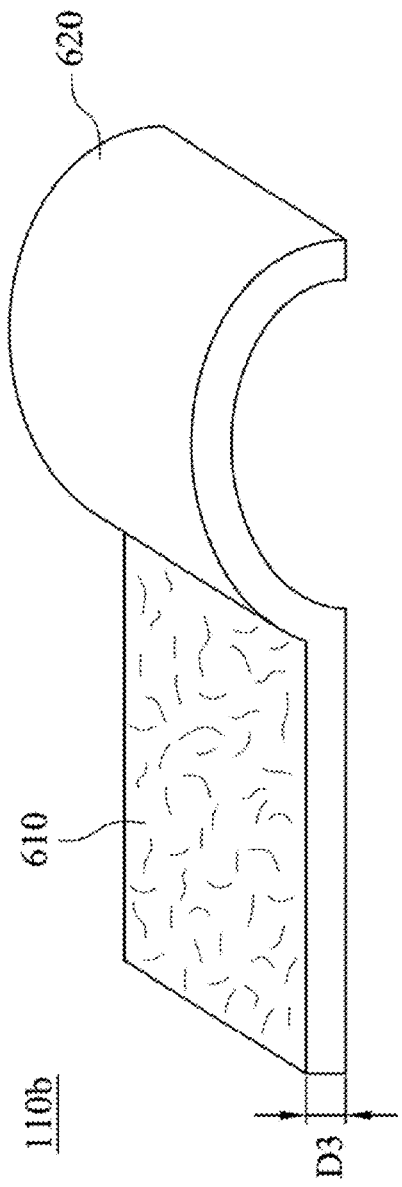
FIG. 7A is a schematic diagram showing a composite PDMS microstructure with flat and curved surfaces.
Figure 7B:
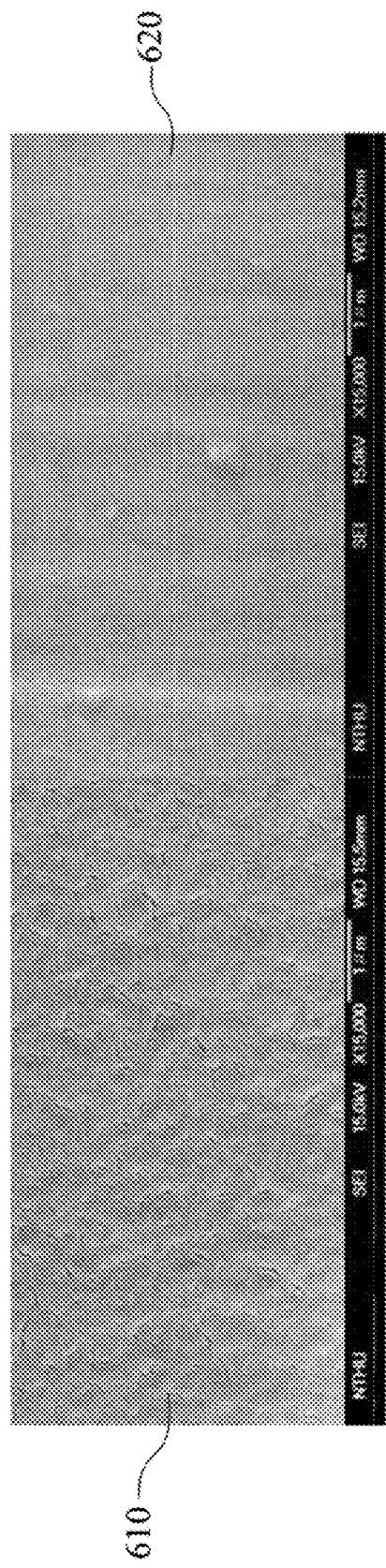
FIG. 7B is an electron microscope image showing the surface structures of the composite PDMS of FIG. 7A.

FIG. 7A is a schematic diagram showing a composite PDMS microstructure 110b with flat and curved surfaces; and FIG. 7B is an electron microscope image showing the surface structures of the composite PDMS of FIG. 7A. In FIG. 7A, the PDMS substrate 210 has a flat surface 610 and a curved surface 620. The flat surface 610 is wrinkled and the curved surface 620 is smooth. A resistance variation rate of the curved surface 620 is smaller than that of the flat surface 610, and thus the electrical property of an electrically conductive layer of the composite PDMS microstructure 110b will be not affected by bending. Hence, the composite PDMS microstructure 110b has sufficient resilience and flexibility.

In order to effectively demonstrate the efficacy of the fabricating method 500 in FIG. 6, the Au film is utilized as the electrically conductive layer of the composite PDMS microstructure 110b, and different adhesive layers are used to test the adhesion strength of the composite PDMS microstructure 110b. The adhesive layers include Ti, Cr, Ni and the MPTMS molecule 230. According to table 1, which shows the test results of adhesion strength for different adhesive layers, it is shown that, when the adhesive layer is the MPTMS molecule 230, the adhesion strength is up to ISO class 0, and 0% Au is dropped off after the test is used with 3M 600 adhesive tape. In other words, the composite PDMS microstructure 110b fabricated by the method 500 in FIG. 6 has the strongest adhesion strength. Therefore, the chemical bond between the PDMS substrate 210 and the Au atom 240 can be significantly enhanced when the adhesive layer is the MPTMS molecule 230.

TABLE 1

| Adhesive layer | Thickness of PDMS substrate (D1) | Thickness of Au film (D2) | Adhesion strength |
|---|---|---|---|
| Non-Adhesive layer | 300 μm | 100 nm | ISO class: 5<br>ASTM class: 0B (>65%) |
| Ti 20 nm | 300 μm | 100 nm | ISO class: 5<br>ASTM class: 0B (>65%) |
| Cr 20 nm | 300 μm | 100 nm | ISO class: 3<br>ASTM class: 2B (15~35%) |
| Ni 20 nm | 300 μm | 100 nm | ISO class: 2<br>ASTM class: 3B (5~15%) |
| MPTMS | 300 μm | 100 nm | ISO class: 0<br>ASTM class: 5B (0%) |

According to the aforementioned embodiments and examples, the advantages of the present disclosure are described as follows.

1. The method of fabricating a composite PDMS microstructure of the present disclosure can form the composite PDMS microstructure from the PDMS substrate which is treated by the special mono-molecule with the thiol group, and thus the adhesion strength between the PDMS substrate and the electrically conductive layer can be enhanced owing to the strong chemical bond between the special mono-molecule with the thiol group and the electrically conductive layer.

2. The method of fabricating a composite PDMS microstructure of the present disclosure can precisely control the thickness of the Au film, the quality of the Au film and the chemical bond between the MPTMS molecule and the Au atom by controlling the deposition conditions of the Au atom.

3. The composite PDMS microstructure fabricated by the method of the present disclosure has sufficient resilience and flexibility. The resistance variation rate of the curved surface is smaller than that of the flat surface, and thus the electrical property of the electrically conductive layer of the composite PDMS microstructure is not affected by bending. Hence, the composite PDMS microstructure has sufficient resilience and flexibility.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A method of fabricating a composite PDMS microstructure, comprising:
   performing a defining step for defining a patterned area having 3-mercaptopropyl trimethoxysilane (MPTMS) on a PDMS substrate;
   performing a depositing step by placing the PDMS substrate having MPTMS into a vacuum chamber for a deposition time so as to deposit a plurality of Au atoms on the patterned area of the PDMS substrate by a vacuum coating process; and
   performing a cleaning step for cleaning the PDMS substrate using water so as selectively retain the Au atoms on the patterned area of the PDMS substrate;
   wherein the vacuum coating process is an evaporation process;
   wherein the evaporation process comprises:

performing a first evaporation step for treating the PDMS substrate by using a 0.5 M methanol with MPTMS for 10 seconds; and performing a second evaporation step for evaporating the Au atoms at an evaporation rate of 0.5 Å/sec to form an Au film, wherein the Au film has a thickness after the second evaporation step;

wherein the deposition time is smaller than or equal to 30 minutes.

2. The method of claim 1, wherein the thickness is greater than or equal to 5 nm and smaller than or equal to 5000 nm.

3. The method of claim 2, wherein the thickness is equal to 100 nm.

4. The method of claim 1, wherein the PDMS substrate has a curved shape.

* * * * *